United States Patent
Zhu et al.

(10) Patent No.: US 11,508,945 B2
(45) Date of Patent: Nov. 22, 2022

(54) 3-D DISPLAY PANEL INCLUDING HEAT DISSIPATION STRUCTURE BETWEEN LIGHT EMITTING UNITS, AND MANUFACTURING METHOD THEREOF

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Aihua Zhu, Beijing (CN); Yun Bai, Beijing (CN); Jianming Huang, Beijing (CN); Wanping Pan, Beijing (CN); Qiusheng Lin, Beijing (CN); Weiqiang Li, Beijing (CN); Xuezhen Su, Beijing (CN); Yabin Lin, Beijing (CN); Li Cheng, Beijing (CN); Hailong Yu, Beijing (CN); Xiaobo Jia, Beijing (CN); You Li, Beijing (CN)

(73) Assignees: Fuzhou BOE Optoelectronics Technology Co., Ltd., Fujian (CN); Beijing BOE Technology Development Co., Ltd., Beijing (CN)

( * ) Notice: Subject to any disclaimer, the term of this patent is extended or adjusted under 35 U.S.C. 154(b) by 245 days.

(21) Appl. No.: 16/763,513

(22) PCT Filed: Oct. 14, 2019

(86) PCT No.: PCT/CN2019/111048
§ 371 (c)(1),
(2) Date: May 12, 2020

(87) PCT Pub. No.: WO2020/078322
PCT Pub. Date: Apr. 23, 2020

(65) Prior Publication Data
US 2021/0135170 A1    May 6, 2021

(30) Foreign Application Priority Data

Oct. 17, 2018   (CN) .......................... 201811209847.5

(51) Int. Cl.
H01L 51/56        (2006.01)
H01L 51/52        (2006.01)

(52) U.S. Cl.
CPC .......... *H01L 51/56* (2013.01); *H01L 51/5271* (2013.01); *H01L 51/5275* (2013.01); *H01L 51/529* (2013.01)

(58) Field of Classification Search
CPC ..... H01L 51/50; H01L 51/52; H01L 51/5271; H01L 51/5275; H01L 51/529; H01L 51/56
(Continued)

(56) References Cited

U.S. PATENT DOCUMENTS 7,633,579 B2    12/2009  Hamagishi et al.
2004/0211971 A1*  10/2004  Takei ................ G02F 1/133603
                                                              257/98
(Continued)

FOREIGN PATENT DOCUMENTS

CN    101241252 A     8/2008
CN    106876566 A  *  6/2017  .......... H01L 33/005
(Continued)

*Primary Examiner* — Matthew E. Gordon

(57) ABSTRACT

The embodiments of the present disclosure provide a display panel, a manufacturing method thereof, and a display device. The display panel includes a first substrate and a second substrate cell-assembled to each other, a light emitting member layer disposed between the first substrate and the second substrate and a light diffusion layer disposed on a light existing side of the light emitting member layer, the light emitting member layer includes a plurality of light emitting units and imaging holes disposed on at least two sides of each of the light emitting units, the light diffusion
(Continued)

layer includes a reflective member configured to reflect a light ray emitted by the light emitting unit and reaching the reflective member, and the reflected light ray reflected by the reflective member exits from the imaging holes.

18 Claims, 9 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2008/0192156 A1* | 8/2008 | Hamagishi | H04N 13/31 |
| | | | 348/E13.03 |
| 2019/0207165 A1* | 7/2019 | Pan | G02B 3/0062 |

FOREIGN PATENT DOCUMENTS

| | | |
|---|---|---|
| CN | 106876566 A | 6/2017 |
| CN | 108198844 A | 6/2018 |
| CN | 108388020 A | 8/2018 |
| CN | 109378404 A | 2/2019 |
| WO | 2011/065721 A2 | 6/2011 |

\* cited by examiner

3-D DISPLAY PANEL INCLUDING HEAT DISSIPATION STRUCTURE BETWEEN LIGHT EMITTING UNITS, AND MANUFACTURING METHOD THEREOF

TECHNICAL FIELD

The present application relates to a display panel, a manufacturing method thereof, and a display device.

BACKGROUND

The organic electroluminance display (abbreviated as OLED) panel due to its auto-luminescent feature does not require a separate light source, and can be made lighter and thinner. The OLED display panel has become a development direction of a concerned future display technology.

At present, small-size OLED display panel have been achieved mass production, however, the production of large-size OLED display panels still has bottlenecks with an extremely low production yield and a relatively high production expense.

SUMMARY OF THE INVENTION

An embodiment of the present disclosure provides a display panel, the display panel includes a first substrate and a second substrate cell-assembled to each other, a light emitting member layer disposed between the first substrate and the second substrate and a light diffusion layer disposed on a light exiting side of the light emitting member layer, the light emitting member layer includes a plurality of light emitting units and imaging holes disposed on at least two sides of each of the light emitting units, the light diffusion layer includes a reflective member configured to reflect a light ray emitted by the light emitting unit and reaching the reflective member, and the reflected light ray reflected by the reflective member exits from the imaging holes.

Optionally, in the display panel provided by an embodiment of the present disclosure, a reflective surface of the reflective member faces a side where the light emitting member layer is located, and the imaging hole is disposed on an optical path of the reflected light ray exiting from the reflective member.

Optionally, in the display panel provided by an embodiment of the present disclosure, the light diffusion layer further comprises a diffusion member disposed between the light emitting unit and the reflective member, the diffusion member is configured to diffuse the light ray emitted by the light emitting unit and passing through the diffusion member, so that the diffused exiting light ray is irradiated onto the reflective member.

Optionally, in the display panel provided by an embodiment of the present disclosure, the light emitting member layer further comprises a heat dissipation structure disposed between adjacent light emitting units, the heat dissipation structure is disposed in a same layer as the light emitting unit, and the imaging hole is a through hole arranged within the heat dissipation structure.

Optionally, in the display panel provided by an embodiment of the present disclosure, adjacent light emitting units share the imaging hole disposed between the adjacent light emitting units, and at least one imaging hole is disposed between the adjacent light emitting units.

Optionally, in the display panel provided by an embodiment of the present disclosure, the reflective member comprises semi-convex lenses provided corresponding to the light emitting units, convex surfaces of the semi-convex lenses are disposed on a side close to the light emitting units, and each of the semi-convex lenses covers the corresponding light emitting unit in a projection region of the light emitting member layer.

Optionally, in the display panel provided by an embodiment of the present disclosure, the reflective member comprises semi-convex lenses disposed in a one-to-one correspondence with the light emitting units, convex surfaces of the semi-convex lenses are disposed on a side close to the light emitting units, and each of the semi-convex lenses covers the corresponding light emitting unit in a projection region of the light emitting member layer.

Optionally, in the display panel provided by an embodiment of the present disclosure, reflective surfaces of the semi-convex lenses are located on a side of the semi-convex lenses opposite to the light emitting unit, the reflective surfaces are planes, and the reflective surfaces are configured to reflect the light ray emitted by the light emitting units to a side where the imaging holes are located.

Optionally, in the display panel provided by an embodiment of the present disclosure, the diffusion member comprises biconvex lenses provided corresponding with the light emitting units, and each of the biconvex lenses covers the corresponding light emitting unit in the projection region of the light emitting member layer.

Optionally, in the display panel provided by an embodiment of the present disclosure, the diffusion member comprises biconvex lenses disposed in a one-to-one correspondence with the light emitting units, and each of the biconvex lenses covers the corresponding light emitting unit in the projection region of the light emitting member layer.

Optionally, in the display panel provided by an embodiment of the present disclosure, positions between the light emitting unit and the corresponding biconvex lens and semi-convex lens satisfy:

$$F<u<2F, \text{ and } r>2F;$$

the u is a center distance between the light emitting unit and the biconvex lens, the F is a focal distance F of the biconvex lens, and the r is a center distance between the biconvex lens and the semi-convex lens.

Optionally, in the display panel provided by an embodiment of the present disclosure, the light diffusion layer further comprises an optical loss layer arranged around the semi-convex lens and the biconvex lens, and the optical loss layer has a refractive index that is greater than refractive indices of the semi-convex lens and of the biconvex lens.

Optionally, in the display panel provided by an embodiment of the present disclosure, materials of the semi-convex lens and the biconvex lens comprise silicone, polymethyl methacrylate, polycarbonate, transparent resin, and glass.

Optionally, in the display panel provided by an embodiment of the present disclosure, the display panel further includes a color filter layer disposed on a light exiting side of the imaging holes and on the first substrate or the second substrate, and a pixel array layer disposed between the first substrate and the second substrate, and located on a light exiting side of the color filter layer.

Optionally, in the display panel provided by an embodiment of the present disclosure, the display panel further includes a color filter layer disposed on a light exiting side of the imaging holes and on the first substrate or the second substrate, and a pixel array layer disposed between the first substrate and the second substrate and located on a side of the light diffusion layer opposite to the color filter layer.

An embodiment of the present disclosure also provides a manufacturing method of a display panel, the manufacturing method of a display panel includes forming a plurality of light emitting units in a light emitting member layer, forming imaging holes located on at least two sides of each of the plurality of light emitting units and forming a reflective member located on a light exiting side of the light emitting member layer, and the reflective member is configured to reflect light ray emitted by the light emitting unit and reaching the reflective member, and the reflected light ray reflected by the reflective member exits from the imaging holes.

Optionally, the manufacturing method of a display panel provided by an embodiment of the present disclosure further includes forming a diffusion member located on the light exiting side of the light emitting member layer, and the diffusion member is located between the light emitting member layer and the reflective member, and the light ray emitted by the light emitting unit is diffused after passing through the diffusion member, so that the diffused exiting light ray is irradiated onto the reflective member.

Optionally, in the manufacturing method of a display panel provided by an embodiment of the present disclosure, the reflective member comprises a semi-convex lens, the diffusion member comprises a biconvex lens, the forming the reflective member and the forming the diffusion member comprises: forming the semi-convex lens using a half tone mask process or a slit mask process; and forming the biconvex lens using a half tone mask process or a slit mask process.

Optionally, in the manufacturing method of a display panel provided by an embodiment of the present disclosure, after the forming the plurality of light emitting units, the method further comprises: forming a heat dissipation structure located between adjacent light emitting units and in a same layer as the light emitting units; the forming the imaging holes located on at least two sides of each of the light emitting units comprises: forming through holes in each of the heat dissipation structures, the through holes are the imaging holes.

An embodiment of the present disclosure also provides a display device, including the display panel as described above.

BRIEF DESCRIPTION OF THE DRAWINGS

The above and/or additional aspects and advantages of the present disclosure will become apparent and readily understood from the description of the embodiments with reference to the drawings below, in which.

DESCRIPTION OF THE EMBODIMENTS

Figure 1:
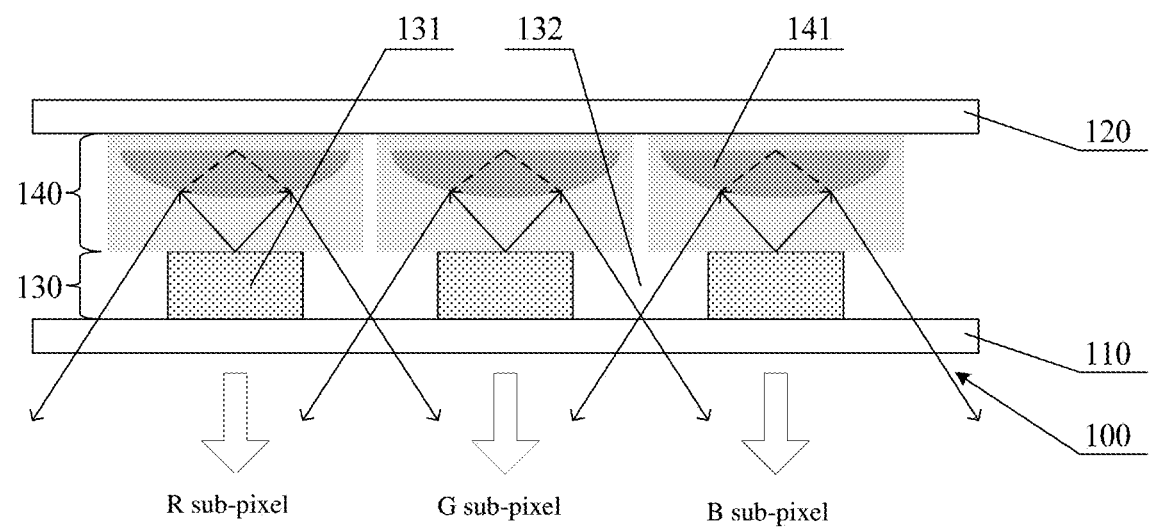
FIG. 1 is a schematic structural diagram of a display panel provided by an embodiment of the present disclosure.

The embodiments of the present disclosure are described in detail below, and examples of the embodiments are shown in the drawings, in which the same or similar reference signs indicate the same or similar elements or elements having the same or similar functions throughout. The embodiments described below with reference to the drawings are exemplary and are only used to explain the present disclosure, and cannot be comprehended as limitation of the present disclosure.

The terms "first" and "second" are used only for the purpose of description and cannot be comprehended as indicating or implying relative importance, or implicitly indicating the number of technical features indicated. Thus, the features defined with "first" and "second" can include at least one of the features either explicitly or implicitly. In the description of the present disclosure, "plurality" has the meaning of two or more, unless otherwise specifically defined.

Unless otherwise defined, the technical or scientific terms used herein shall have ordinary meaning understood by one of ordinary skill in the art to which the invention belongs. The terms "first", "second," and the like used in the present disclosure are not intended to indicate any order, amount, or importance, but distinguish different constituent parts. The terms "comprise," "comprising," "include," "including," etc., means that an element or object preceding the word encompasses element(s) or object(s) listed after this word and equivalents thereof, without excluding other elements or objects. The terms "connected" or "connecting" and the like are not limited to physical or mechanical connections, but can include electrical connections, whether direct or indirect. "on", "under", "left", "right" and the like are only used to indicate relative positional relations, and when an absolute position of an object described is changed, its relative positional relation may also be changed accordingly.

Because compared with a small-size OLED display panel, the power consumption of a large-size OLED display panel increases, and all interiors of the OLED display panel are solid, difficulty in heat dissipation and increasing of the power consumption inevitably cause an increasing of heat within the display panel, which increases a burn-in screen probability of the display panel.

The following example embodiments provided by the present disclosure may be combined with each other, and the same or similar concepts or processes may not be repeated in some embodiments.

FIG. 1 is a schematic structural diagram of a display panel provided by an embodiment of the present disclosure. The display panel 100 provided by the embodiment may include:

a first substrate 110 and a second substrate 120 cell-assembled with each other, a light emitting member layer 130 disposed between the first substrate 110 and the second substrate 120, and a light diffusion layer 140 disposed on a light exiting side of the light emitting member layer 130.

Herein, the light emitting member layer 130 includes a plurality of light emitting units 131 and imaging holes 132 disposed on at least two sides of each of the light emitting units 131; the light diffusion layer 140 includes a reflective member 141 that is used to reflect light rays which are emitted by the light emitting units 131 and arrive at the reflective member 141, and the reflected light ray reflected by the reflective member exits from the imaging hole. The reflected light ray, after passing through the imaging holes 132 on at least two sides of the light emitting unit 131 respectively, are imaged, so that the light ray emitted by each of the light emitting units 131 forms at least two images.

Alternatively, a reflective surface of the reflective member faces a side where the light emitting member layer is located, the reflective member reflects the light ray towards the imaging hole, and the imaging hole is disposed on an optical path of the reflected light ray exiting from the reflective member.

FIG. 1 illustrates a cross-sectional view of a display panel 100, and FIG. 1 only illustrates a portion of structures in the display panel 100. The display panel 100 is a self-luminescent type display panel, for example, may be an OLED panel, a micro light emitting diode (abbreviated as: micro LED) panel, or other types of display panels that can realize self-luminescence. The following embodiments of the present disclosure are described by taking an OLED display panel as an example. The OLED display panel 100 may be a bottom emitting type or a top emitting type display panel. FIG. 1 illustrates a structure of a bottom emitting type display panel as an example. The display panel 100 is an auto-luminescent device, light ray emitted by the light emitting unit 131 of the display panel 100 exits from a top or bottom thereof. Using the bottom emitting type display panel shown in FIG. 1 as an example, the light emitting unit 131 may include a cathode layer, an organic light emitting layer (Electro Luminesence, abbreviated as EL), and an anode layer, light ray produced by the organic light emitting layer exits from the cathode layer at the top, and the emitted light ray is irradiated to the reflective member 141 of the light diffusion layer 140, and the reflective member 141, as a solid structure having a reflective function, can reflect the light ray reaching the reflective member 141 at a particular angle, and the reflected light ray is irradiated to regions of the imaging holes 132 on at least two sides of the light emitting unit 131.

Figure 2:
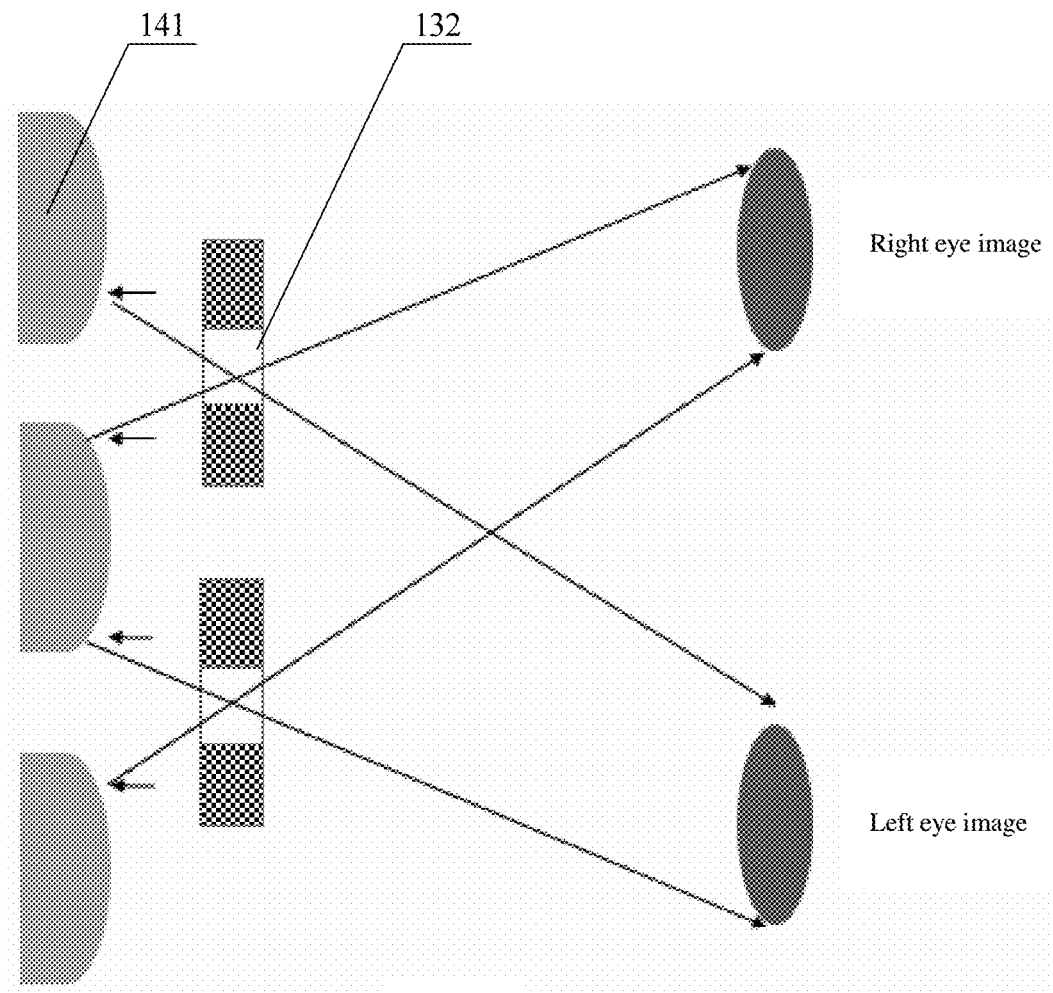
FIG. 2 is a schematic diagram of a principle of naked-eye 3D imaging.

In an embodiment of the present disclosure, each of at least two sides of each of the light emitting unit 131 may be disposed with one imaging hole 132, that is, the light ray emitted by each of the light emitting units 131 may be imaged at least through two imaging holes 132 adjacent to it. The principle of the display panel 100 provided by an embodiment of the present disclosure for achieving 3D display is described briefly below. After the light ray emitted by the light emitting unit 131 is reflected by the reflective member 141, the light ray may pass through the imaging holes 132 on at least two sides of the light emitting unit 131 (as shown in FIG. 1, the light emitting unit 131 has one imaging hole 132 on each side), so that both light ray emitted by the light emitting unit 131 for a left eye image and light ray emitted by the light emitting units 131 for a right eye image respectively exit through the imaging holes 132 on at least two sides thereof and enter into the left eye and the right eye, one of these two images is the left eye image and the other one thereof is the right eye image, so that a naked-eye 3D display effect can be achieved by means of the parallax of the left and right eyes. As shown in FIG. 2 which is a schematic diagram of a principle of naked-eye 3D imaging, FIG. 2 shows the imaging hole 132 and the reflective member 141 of the display panel 100 and the optical path of the 3D imaging, and illustrates an image which is formed by light ray arriving at the left eye and an image which is formed by light ray arriving at the right eye.

Moreover, the light ray emitted by each of the light emitting units 131 may pass through the imaging holes 132 on at least two sides thereof and exit after reflected by the reflective member 141, so that it has a magnification effect on the image formed by the light emitting unit 131, and thus achieving a display effect of a large-size OLED display panel by producing a small-size OLED display panel.

It should be noted that the embodiment of the present disclosure is not limited to only dispose two imaging holes 132 on two sides of each of the light emitting units 131 for achieving 3D display, and there also may be more imaging holes on the two sides of the light emitting units 131, for example, the 3D display effect can be realized by disposing three imaging holes 132 on the two sides of the light emitting unit 131. The display panel 100 provided by embodiments of the present disclosure can also achieve the 3D display effect by disposing four imaging holes 132 on the two sides of the light emitting unit 131. The number of imaging holes 132 influences on the displaying effect of a 3D image, and increasing of the imaging holes 132 can make the 3D display image exquisite. The embodiment shown in FIG. 1 illustrates a structure of the display panel 100 and an imaging optical path by taking a case in which one imaging hole 132 is disposed on each of the two sides of each of the light emitting unit 131 of the display panel 100 respectively and the light ray of each of the light emitting units 131 passes through the two imaging holes 132 for achieving the 3D display effect as an example.

Figure 3:
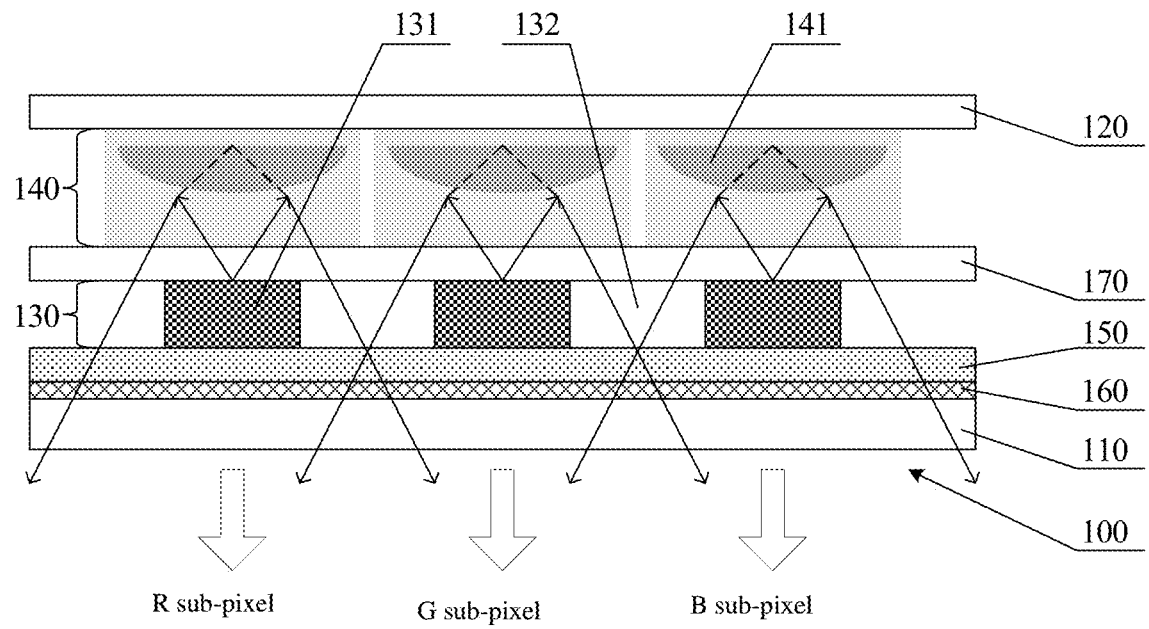
FIG. 3 is a schematic structural diagram of another display panel provided by an embodiment of the present disclosure.
Figure 4:
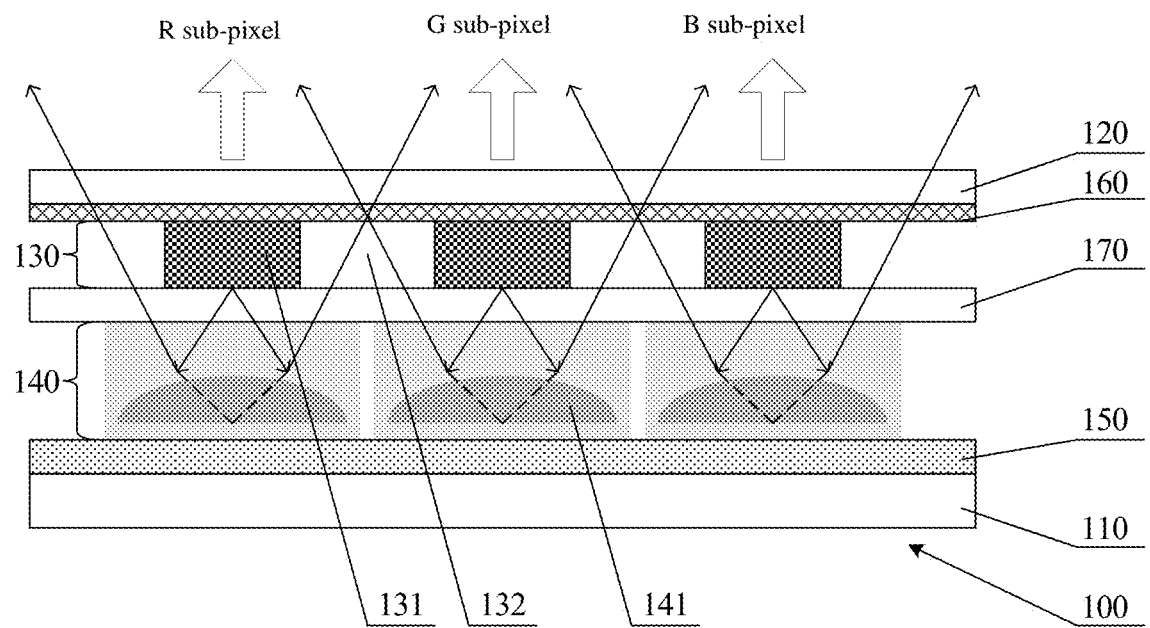
FIG. 4 is a schematic structural diagram of yet another display panel provided by an embodiment of the present disclosure.

FIG. 3 is a schematic structural diagram of another display panel provided by an embodiment of the present disclosure. The display panel 100 provided by the embodiment of the present disclosure also has a conventional structure and includes: a pixel array layer 150 disposed on a side of the first substrate 110 close to the second substrate 120 (the pixel array layer 150 includes a thin-film transistor (TFT) for performing the switching control to the light emitting unit 131), and a color filter layer (abbreviated as: CF) 160 disposed on a light exiting side of the imaging hole and located inside the first substrate 110 or the second substrate 120; for implementation on the manufacturing process, a transparent isolation layer 170 may be also disposed between the light emitting member layer 130 and the light diffusion layer 140. It should be noted that, in the display panel 100 provided by the embodiment of the present disclosure, specific positions of the light emitting member layer 130, the light diffusion layer 140, and the CF 160 are related to the light emitting type of the display panel 100, and FIG. 1 and FIG. 3 illustrate a specific structure of the bottom emitting type display panel, i.e., the light emitting member layer 130 is located on a side close to the first substrate 110, the light diffusion layer 140 is located on a side close to the second substrate 120, and the CF 160 is located between the pixel array layer 150 and the first substrate 110. As shown in FIG. 4 which is a schematic structural diagram of yet another display panel provided by an embodiment of the present disclosure, FIG. 4 illustrates a specific structure of a top emitting type display panel, i.e., the light emitting member layer 130 is located on a side close to the second substrate 120, the light diffusion layer 140 is located on a side close to the first substrate 110, and the CF 160 is located between the light emitting member layer 130 and the second substrate 120. In addition, the conventional structure of the display panel 100 shown in FIG. 3 and FIG. 4 further includes a seal structure, such as a sealant disposed between the first substrate 110 and the second substrate 120, which is not shown in FIG. 3 and FIG. 4, and the sealant is disposed on an edge position for bonding two layers of the substrates, and the sealant may be an ultraviolet ray curing (abbreviated as: UV) adhesive.

It should be noted that the embodiments of the present disclosure shown in FIG. 1 to FIG. 4 do not illustrate an entire structure of the display panel 100, but only illustrate three light emitting units 131 in the display panel. The three light emitting units 131 may be light emitting units which are used respectively to form a red sub-pixel, a green sub-pixel, and a blue sub-pixel (abbreviated as: RGB). In addition, the embodiments of the present disclosure do not limit corresponding relation between the light emitting units 131 and the reflective members 141, and the display panel 100 shown in FIG. 1 to FIG. 4 is shown by taking a case that the reflective members 141 are disposed in a one-to-one correspondence relationship at a light exiting side of the light emitting units 131 as an example, for example, one reflective member 141 may also be disposed on the light exiting side of the RGB sub-pixels (that is, three light emitting units 131). An arrangement manner of the reflective members 141 that after light rays emitted by the light emitting units 131 in the light emitting member layer 130 are reflected, the reflected light rays can pass through the imaging holes 132 for achieving the 3D display on at least two sides of each of the light emitting units 131 in order to achieve the 3D display effect may be applied to the embodiments of the present disclosure.

In the display panel 100 provided by an embodiment of the present disclosure, the light emitting member layer 130 including the plurality of light emitting units 131 is disposed between the first substrate 110 and the second substrate 120 cell-assembled with each other; and also the light emitting member layer 130 is provided with the imaging holes 132 which is located on at least two sides of each of the light emitting units 131; and the reflective member 141, which is disposed in the light diffusion layer 140 located on a light exiting side of the light emitting member layer 130, may reflect the light ray emitted by the light emitting unit 131 and arriving at the reflective member 141, and the reflected light ray is imaged after passing through the imaging holes 132 on at least two sides of the light emitting unit 131 respectively, so that the light ray emitted by each of the light emitting units 131 forms at least two images. In a structure of the above display panel 100 provided by the present disclosure, at least two images are formed by the reflected light ray passing through the imaging hole 132, i.e., the naked-eye 3D display effect is realized by means of the image parallax, and compared with the prior art in which the 3D display is realized by using a grating and a liquid crystal, a structure for achieving the 3D display used in the present disclosure is beneficial to reduce cost.

Further, in an embodiment of the present disclosure, the imaging holes 132 on at least two sides of the light emitting unit 131 are used to perform the magnified imaging of the reflected light rays passing through the imaging holes 132 after being reflected by the reflective member 141, so that the light ray emitted by each of the light emitting units 131 can form at least two magnified images.

That is to say, in the display panel 100 provided by an embodiment of the present disclosure, after the light ray emitted by the light emitting unit 131 is reflected by the reflective member 141, the reflected light ray can also have a diffusion effect, i.e., the reflected light ray is magnified and then irradiated to regions of the imaging holes 132 on at least two sides of the light emitting unit 131. It can be seen that because the imaging holes 132 are located on at least two sides of the light emitting unit 131, and the light emitting unit 131 may perform imaging through the imaging holes 132 adjacent thereto, that is to say, when the display panel 100 provided by embodiments of the present disclosure is designed, it is required that the reflective member 141 has the light diffusion effect while reflecting the light ray, so that the reflected light ray can be irradiated to the regions of the imaging holes 132 on at least two sides of the light emitting unit 131, i.e., while the reflective member 141 and the imaging holes 132 achieve their own reflective function or the 3D display effect, the combined usage has a diffusion effect on the light ray emitted by the light emitting unit 131.

Based on a position relationship of the light emitting unit 131, the reflective member 141, and the imaging hole 132, in a structure of the above-described display panel 100 provided by the present disclosure, the reflective member 141 and the imaging hole 132 which are located on at least two sides of the light emitting unit 131 have a magnification effect on an image formed by the light emitting unit 131, which can achieve the display effect of the large-size OLED display panel by production of the small-size OLED display panel, and the small-size OLED display panel is easily produced and has a relatively low cost, and problems of high power consumption and poor heat dissipation performance of the large-size OLED display panel are avoided.

Figure 5:
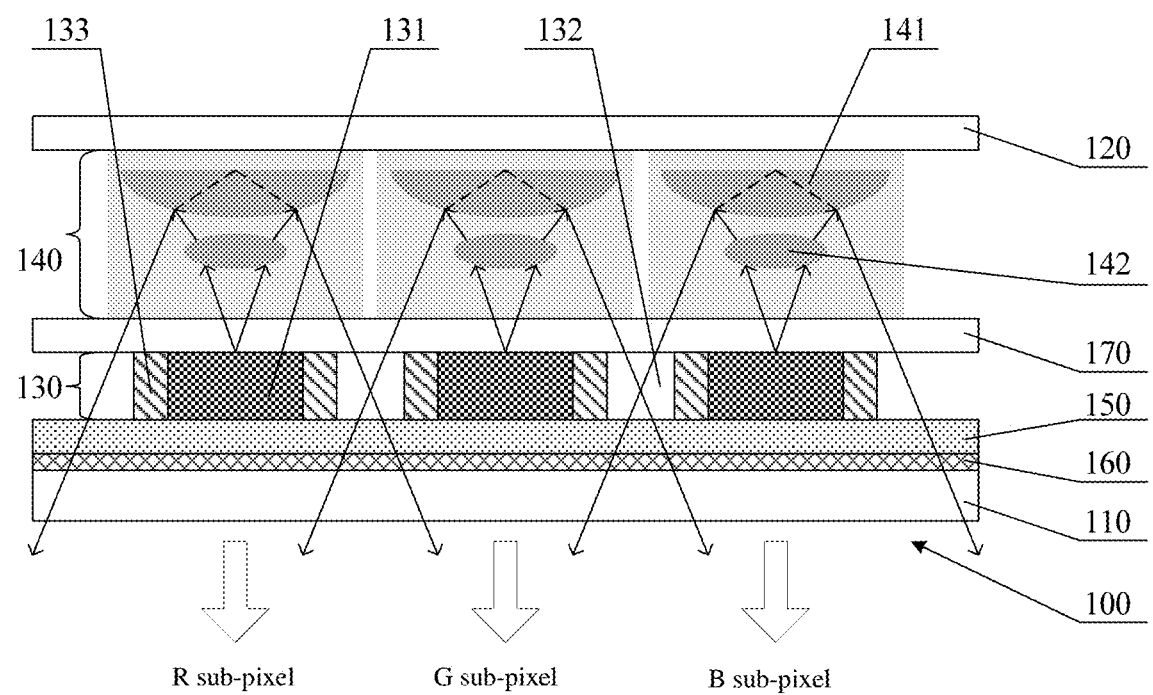
FIG. 5 is a schematic structural diagram of still yet another display panel provided by an embodiment of the present disclosure.

Optionally, FIG. 5 is a schematic structural diagram of still yet another display panel provided by an embodiment of the present disclosure. Based on the structure of the display panel 100 shown in FIG. 3, the display panel 100 provided by the embodiment of the present disclosure may further include a diffusion member 142 disposed between the light emitting unit 131 and the reflective member 141.

The diffusion member 142 in the embodiment of the present disclosure is used for diffusing the light ray emitted by the light emitting unit 131 and passing through the diffusion member 142, so that the diffused exiting light ray is irradiated onto the reflective member 141.

In the display panel 100 provided by an embodiment of the present disclosure, not only diffusion function of the light ray emitted by the light emitting unit 131 can be realized by a structure of the reflective member 141 and the imaging hole 132, but also the light ray emitted by the light emitting unit 131 is diffused by the diffusion member 42 disposed between the light emitting unit 131 and the reflective member 141. In the embodiment of the present disclosure, an image formed by the light ray emitted by the light emitting unit 131 has the twice magnification effects. An optical path principle in the embodiment of the present disclosure is described with reference to the structure shown in FIG. 5, a light ray emitted by the light emitting unit 131 first reaches the diffusion member 142, by using the diffusion effect of the diffusion member 142 on the light ray, a first magnification effect of an image is achieved; the scattered light ray reaches the reflective member 141, and by using the reflection and diffusion effect of the reflective member 141 on the light ray, i.e., the light ray is reflected by changing the optical path, the reflected light ray passes through the imaging holes 132 on the two sides of the light emitting unit 131, which realizes a second magnification effect and the 3D imaging effect of an image, and eventually realizes the 3D magnification display of the image. By disposing the diffusion member 142 in the embodiment of the present disclosure, the image magnification effect of the display panel 100 can be further improved, i.e., the production difficulty of the large-size OLED display panel can be further reduced.

It should be noted that the embodiment of the present disclosure does not limit a corresponding relationship between the light emitting unit 131 and the diffusion member 142, and the display panel 100 shown in FIG. 5 is shown by taking a case that the diffusion members 142 are disposed in a one-to-one correspondence relationship on the light exiting side of the light emitting units 131 as an example, for example, one diffusion member 142 may also be disposed on the light exiting side of the RGB sub-pixels (that is, three light emitting units 131). The arrangement manner of the diffusion member 142 in which the diffusion member 142 has a diffusion effect on the light ray emitted by all light emitting units 131 in the light emitting member layer 130 may be applied to the embodiments of the present disclosure.

Figure 6:
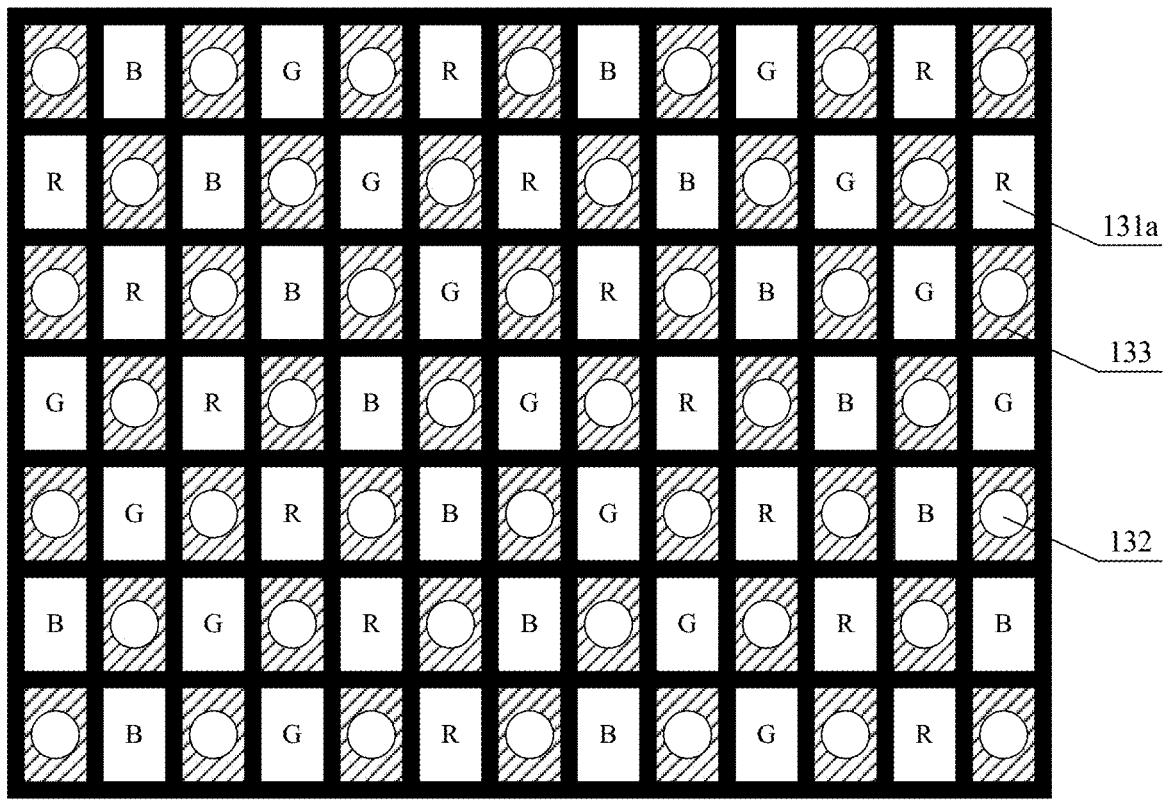
FIG. 6 is a top view of a light emitting member layer in a display panel provided by an embodiment of the present disclosure.

Optionally, in an embodiment of the present disclosure, the light emitting member layer 130 further includes a heat dissipation structure 133 disposed between adjacent light emitting units 131 and disposed in the same layer as an organic light emitting layer of the light emitting unit 131, and the imaging hole 132 is a through hole arranged within the heat dissipation structure 133; a structure of the above heat dissipation structure 133 and the imaging hole 132 is shown in reference with FIG. 5. As shown in FIG. 6 which is a top view of a light emitting member layer in a display panel provided by an embodiment of the present disclosure, FIG. 6 illustrates a planar structure of the organic light emitting layer of the light emitting unit 131, and FIG. 6 is shown by taking a case that sub-pixels 131a of the display panel 100 (i.e., pixels formed by the organic light emitting layer inside the light emitting unit 131) includes red, green, and blue (abbreviated as: RGB) sub-pixels 131a and one imaging hole 132 is arranged in the heat dissipation structure 133 between the adjacent light emitting units 131 (actually, the heat dissipation structures 133 may be disposed between the adjacent sub-pixels 131a), i.e., one imaging hole 132 is disposed on each of the two sides of each of the light emitting units 131 respectively as an example.

In the embodiment of the present disclosure, due to the use of the diffusion member 142, it renders that the sub-pixel presents the first magnification effect, and the interval between the adjacent sub-pixels 131a in the light emitting member layer 130 increases after the sub-pixel is magnified; in addition, the second magnification effect of the reflective member 141 is actually to implement the second magnification imaging by disposing the imaging hole 132 in the increased interval between the adjacent sub-pixels 131a after the first magnification, and to complete the display function of the large-size OLED, which can visually make a larger image to be presented on the small-size OLED display panel, thus solve the bottleneck problems in the manufacturing process of the existing large-size OLED display panel, and also which greatly reduces the raw materials required for producing the organic light emitting layer, thereby reducing the production cost of the OLED display panel.

In the embodiments of the present disclosure, whether the magnification effect of an image obtained by combing the reflective member 141 with the imaging hole 132 is adopted or the magnification effect of an image obtained by using the diffusion members 142 is adopted, the interval between the adjacent sub-pixels 131a becomes larger. Based on the structural feature that the interval between the adjacent sub-pixels 131a becomes larger, not only the light emitting raw material used for producing the sub-pixel 131a is saved, but also the heat dissipation effect of the display panel can be improved by disposing the heat dissipation structure 133 in the interval between the adjacent sub-pixels. In addition, both the heat dissipation structure 133 and the imaging hole 132 disposed within the heat dissipation structure 133 may be located in a process layer where the sub-pixel 131a is located, i.e., in the organic light emitting layer. Therefore, the display panel 100 provided by the embodiment of the present disclosure has high integration degree and relatively low cost, and the periphery of the imaging hole 132 is surrounded by the heat dissipation structure 133, which is beneficial to improve the heat dissipation performance of the entire display panel, thereby increasing the service life of the display panel.

It should be noted that FIG. 6 is shown by taking a case that one imaging hole 132 is disposed in each of the heat dissipation structures 133, i.e., one imaging hole 132 is disposed on each of the two sides of each of the light emitting units 131 respectively as an example; optionally, the structure shown in FIG. 5, the imaging hole 132 may be disposed at a central position of the heat dissipation structure 133 where the imaging hole 132 is, i.e., centers of the imaging hole 132 and the heat dissipation structure 133 coincide. In addition, the embodiments of the present disclosure do not limit to the number of imaging hole 132 arranged in each of the heat dissipation structures 133. If two imaging holes 132 are arranged in each of the heat dissipation structures 133, then two imaging holes 132 are disposed on each of the two sides of the light emitting units 131 respectively, and the arranged number of imaging holes 132 determines the image resolution when the display panel 100 implements 3D display.

In practical application, as shown in FIG. 1 to FIG. 6, the adjacent light emitting units 131 may share the imaging hole 132 between the adjacent light emitting units 131. Referring to optical paths in FIG. 1 to FIG. 5, it may be seen that the imaging hole 132 between the adjacent light emitting units may be used as a hole for imaging of the light emitting units 131 on the two sides of the imaging hole 132, i.e., the reflected light rays of the light emitting units 131 on the two sides of the imaging hole 132 may pass through the imaging hole 132 for imaging. For the left light emitting unit 131 thereof, the imaging hole 132 is used for forming a right eye image of 3D display, and for the right light emitting unit 131 thereof, the imaging hole 132 is used for forming a left eye image of the 3D display.

Optionally, in a structure of the display panel 100 shown in FIG. 5, the reflective member 141 includes semi-convex lenses (i.e., the reflective member 141 in FIG. 5) disposed in one-to-one correspondence relationship with the light emitting units 131, in which the convex surface of the semi-convex lens is disposed on a side close to the light emitting unit 131, and each of the semi-convex lenses covers the corresponding light emitting unit 131 in a projection region of the light emitting member layer 130.

Furthermore, in the embodiment of the present disclosure, the diffusion member 142 includes biconvex lenses (i.e., the diffusion member 142 in FIG. 5) in one-to-one correspondence relationship with the light emitting units 131, and each of the biconvex lenses covers within the region of the corresponding light emitting unit 131 in the projection region of the light emitting member layer 130.

Figure 7:
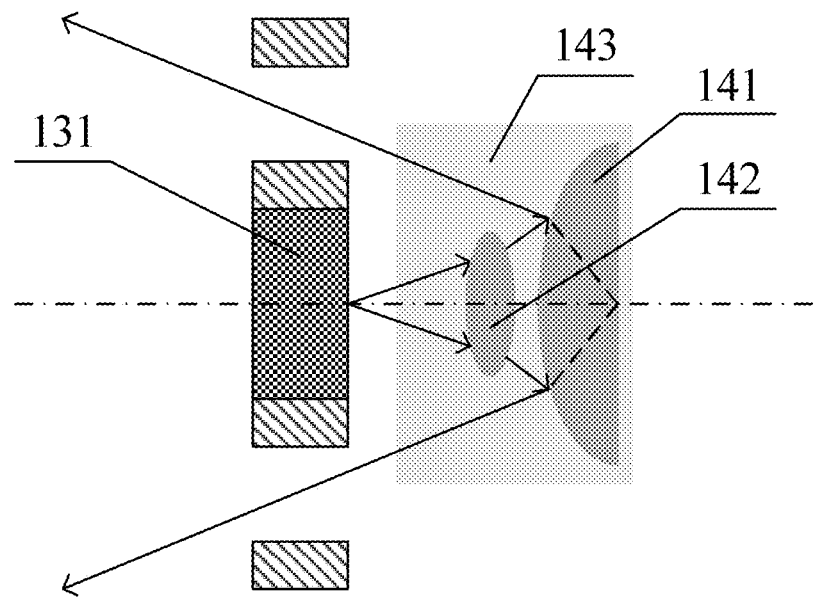
FIG. 7 is a schematic diagram of an optical path principle of the display panel shown in FIG. 5.

The specific structure of the display panel 100 provided by an embodiment of the present disclosure adopts the biconvex lens (denoted as Len1) as a hardware structure having the first magnification effect on the light ray emitted by the light emitting unit 131, and the semi-convex lens (denoted as Len2) as a hardware structure having reflection and second magnification effect on the light ray emitted by the light emitting unit 131. As shown in FIG. 7 which is a schematic diagram of an optical path principle of the display panel shown in FIG. 5, FIG. 7 illustrates the operating effect on the optical path, the magnified display and 3D imaging effect on an image of the Len1 and the Len2 corresponding to the light emitting unit 131 by taking the optical path of the light ray emitted by one light emitting unit 131 as an example.

Optionally, in an embodiment of the present disclosure, the light diffusion layer 140 further includes a light loss layer 143 disposed around the semi-convex lens and the biconvex lens, and the light loss layer 143 has a refractive index that is greater than refractive indices of the semi-convex lens and of the biconvex lens. The arrangement of the structure can increase the diffusion factor of light, and the refractive index of the light loss layer 143 may be equal to a refractive index of a transparent isolation layer 170 adhered thereto, which realizes linear propagation of the light ray and is beneficial to avoid crosstalk phenomenon of the light ray.

In practical application, an ingredient of the optical loss layer 143 may include epoxy acrylate copolymer with a proportion of 5-30%, multifunctional base monomer with a proportion of 0-3%, and propylene glycol methyl ether acetate with a proportion of 60-90%.

Optionally, in the embodiments of the present disclosure, the semi-convex lens and the biconvex lens are of a material including silicone, polymethyl methacrylate (PMMA), polycarbonate (PC), transparent resin and glass. In practical production, different materials may be selected depending on different product requirements.

In practical application of the display panel 100 shown in FIG. 5 above, since a conjugate point F0 of the biconvex lens (Len1) and the semi-convex lens (Len2) is on the same axis, positions between the light emitting unit 131 and the corresponding biconvex lens and semi-convex lens satisfy:

$$F<u<2F, \text{ and } r>2F; \quad (1)$$

Figure 8:
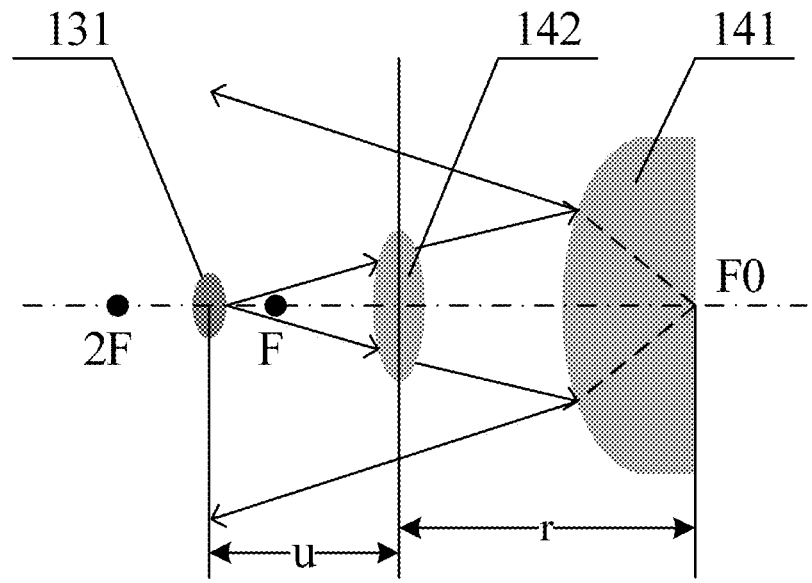
FIG. 8 is a schematic diagram of a positional relationship between a light emitting unit and a lens in a display panel provided by an embodiment of the present disclosure.
Figure 9:
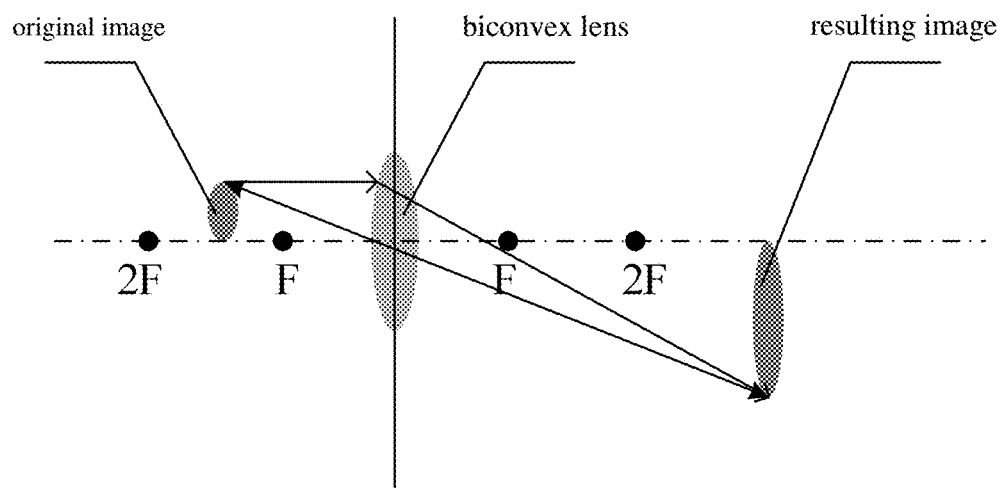
FIG. 9 is a schematic diagram of an imaging principle of a biconvex lens.

As shown in FIG. 8 which is a schematic diagram of a positional relationship between a light emitting unit and a lens in the display panel provided by an embodiment of the present disclosure. In the above formula (1), u is a center distance between the light emitting unit 131 and the biconvex lens, F is a focal distance F of the biconvex lens, r is a center distance between the biconvex lens and the semi-convex lens, the conjugate point of the semi-convex lens is F0, and an intersection point of reverse extended lines of the reflected light rays is the conjugate point F0. Based on the imaging principle of the biconvex lens, an object distance is between F and 2F, and an image distance is greater than 2F, thus a magnified real image can be presented as shown in FIG. 9 which is a schematic diagram of an imaging principle of a biconvex lens. The specific positions of the light emitting unit 131 and the corresponding biconvex lens and semi-convex lens in the embodiment of the present disclosure are disposed by using the above mentioned imaging principle, the light emitting unit 131 is an object to be imaged, by using the magnification effect of the biconvex lens, light rays of the object realize the first magnification imaging on the semi-convex lens, and the second magnification imaging is realized after the light rays pass through the imaging holes 132 on the two sides of the light emitting unit 131 due to the reflection effect of the semi-convex lens.

In practical application, a focal distance f' and a spherical radius of the semi-convex lens satisfy the following relationship: PGP-71F $$f' = \frac{n*r_1*r_2}{(n-1)[n(r_2-r_1)+(n-1)d]}; \quad (2)$$

In the above formula (2), the n is a refractive index of the semi-convex lens, the d is a thickness of the semi-convex lens, the r1 and r2 are curvature radii of two surfaces of the semi-convex lens, in which the r1 is a curvature radius of a convex surface and the r2 is a curvature radius of a plane, and thus, a relationship expression of the focal distance f' of the semi-convex lens may be obtained from the formula (2):

$$f' = \frac{n*r_1}{n-1}; \quad (3)$$

Figure 10:
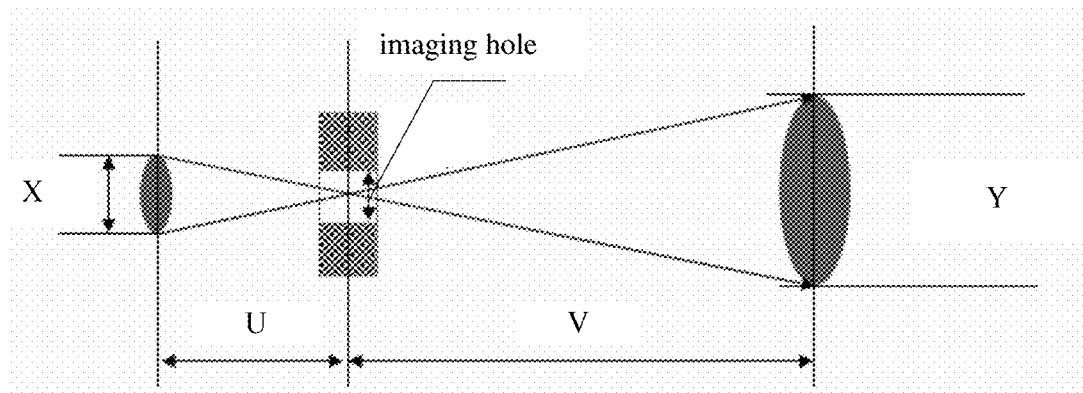
FIG. 10 is a schematic diagram of principle of imaging using an imaging hole.

According to the above formulas (1) and (3), design parameters of the light emitting unit 131, the biconvex lens and the semi-convex lens may be obtained. After the semi-convex lens reflects and diffuses the light ray, the imaging principle of the second magnification realized by the imaging hole 132 is shown as FIG. 10 which is a schematic diagram of imaging principle using an imaging hole. A size X of an original image in FIG. 10 satisfies the following relationship expression:

$$X = \frac{YU + \Phi(U+v)}{V}; \quad (4)$$

In the above formula (4), the X is a size of the original image, which is equivalent to a size of an image after the light rays emitted by the light emitting unit 131 are first imaged on the semi-convex lens, and the Y is a size of an resulting image, which is equivalent to a size of an image after the light rays reflected by the semi-convex lens is second imaged through a certain imaging hole 132, the U is a center distance between the original image and the imaging hole, the V is a center distance between the resulting image and the imaging hole 132, and the Φ is a diameter of the imaging hole 132.

In the design of the display panel 100 provided by the embodiments of the present disclosure, commercial available optical design software may be used to calculate various parameters in the display panel according to different application occasions (such as an optimal viewing distance, an house, an outdoor exhibition board, a cinema, a portable mobile phone, and etc.). Common optical design softwares on the market include such as CodeV, ZEMAX (CodeV, ZEMAX are names of the optical design software), and etc., and according to the calculation requirements of the software, it only needs to provide parameters including a type of optical surface (such as the semi-convex lens or the biconvex lens), a curvature radius of the lens, a material of the lens, a size and shape of the imaging hole, an F-number of the conjugate image space, a numerical aperture of the object space, a paraxial F-number of the image space, and etc. for simulation setting.

Based on the display panel 100 provided by the above-described embodiments of the present disclosure, the embodiments of the present disclosure also provide a manufacturing method for a display panel, which is used for manufacturing the display panel 100 provided by any one of the above-described embodiments of the present disclosure.

Figure 11:
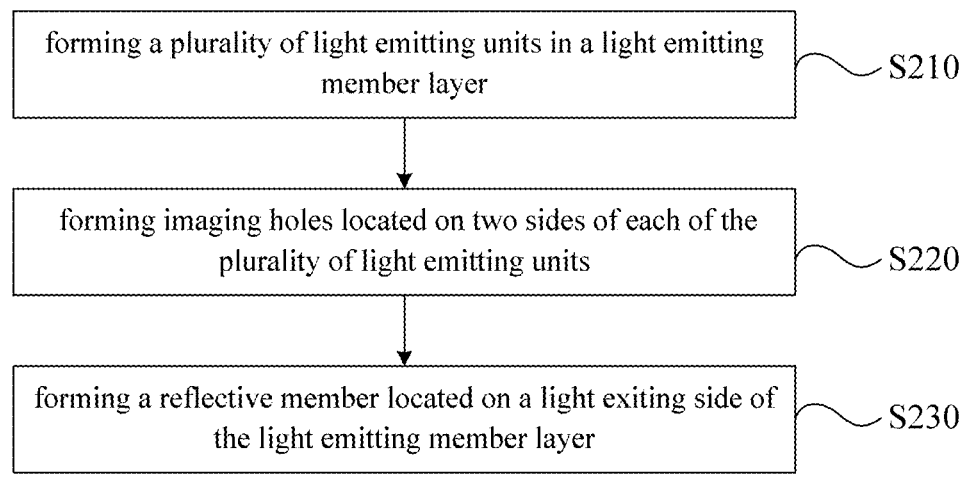
FIG. 11 is a flowchart of a manufacturing method for a display panel provided by an embodiment of the present disclosure.

As shown in FIG. 11, it is a flowchart of a manufacturing method of a display panel provided by an embodiment of the present disclosure. The method provided by the embodiment of the present disclosure may include the following steps:

S210, forming a plurality of light emitting units in a light emitting member layer;

S220, forming imaging holes located on two sides of each of the plurality of light emitting units.

The method provided by the embodiment of the present disclosure, after S220 or before S210, may further include:

S230, forming a reflective member located on a light exiting side of the light emitting member layer; in which, the light ray emitted by the light emitting unit after arriving at the reflective member is reflected, and the reflected light ray is imaged after passing through the imaging holes on two sides of the light emitting unit respectively, so that the light ray emitted by each of the light emitting units form at least two images.

In the embodiments of the present disclosure, the display panel formed by the above steps is a self-luminescent type display panel, for example, it may be an OLED panel, a micro LED panel, or other type of the display panel that can realize self-luminescence. The following embodiment of the present disclosure illustrates the manufacturing steps thereof by using the OLED display panel as an example. Whether a step for forming the reflective member is before forming the light emitting unit or after forming the imaging holes depends on the type of the display panel: if the display panel to be manufactured is a bottom emitting type, then S230 is executed after 220, which is shown in FIG. 11 using the method as an example; if the display panel to be manufactured is a top emitting type, then the reflective member is formed after 210. A structure of the display panel manufactured by using the embodiments of the present disclosure is shown in the above FIG. 1, FIG. 3 to FIG. 5, in which the above figures show cross-sectional views during the manufacturing process, the light emitting unit in the embodiment of the present disclosure may also include a cathode layer, an organic light emitting layer and an anode layer, and layers of the light emitting unit may be formed by using different processes. Since the display panel in the embodiment of the present disclosure is a bottom emitting type or a top emitting type OLED display panel, and thus a sequential order of manufacturing the light emitting member layer and the reflective member is determined by the type of the display panel.

The embodiment of the present disclosure is illustrated by using a structure of a bottom emitting OLED display panel as an example, a light ray generated by the organic light emitting layer inside the light emitting unit exits from the cathode layer at the top, and the emitted light ray is irradiated to the reflective member of the light diffusion layer, and the reflective member, as a solid structure having a reflective function, can reflect the light ray reaching the reflective member at a particular angle, and the reflected light ray is irradiated to regions of the imaging holes 132 on two sides of the light emitting unit.

It should be noted that a corresponding structure and a 3D display principle of the display panel manufactured by the embodiments of the present disclosure for achieving the naked-eye 3D display, and a conventional structure of the OLED display panel have been described in detail in the above embodiments, and so they will not be repeated herein.

For the manufacturing method of a display panel provided by an embodiment of the present disclosure, in the above-described structure that is manufactured by forming the plurality of light emitting units of the light emitting member layer, forming the imaging holes on the two sides of each of the light emitting units, and forming the reflective member located on the light exiting side of the light emitting member layer, the light ray emitted by the light emitting unit is reflected after arriving at the reflective member, and the reflected light ray is imaged after passing through the imaging holes on two sides of the light emitting unit respectively, so that the light ray emitted by each of the light emitting units forms at least two images. By using the display panel manufactured by the manufacturing method of a display panel provided by the present disclosure, at least two images are formed by the reflected light ray passing through the imaging hole, i.e., the naked-eye 3D display effect is realized by means of the image parallax, compared with the 3D display realized by using a grating and a liquid crystal in the prior art, the structure utilized for achieving the 3D display is beneficial to reduce cost in the present disclosure.

Further, in an embodiment of the present disclosure, the imaging holes on two sides of the light emitting units may perform imaging after magnifying on the reflected light ray passing through the imaging holes after being reflected by the reflective member, so that the light ray emitted by each of the light emitting units may form at least two magnified images.

That is to say, in the display panel manufactured by the manufacturing method provided by an embodiment of the present disclosure, after the light ray emitted by the light emitting unit is reflected by the reflective member, the reflected light ray can also have a diffusion effect, i.e., the reflected light ray is magnified and then irradiated to regions of the imaging holes on at least two sides of the light emitting unit. It can be seen that because the imaging holes are located on two sides of the light emitting unit, and the light emitting unit may perform imaging by using the imaging holes 132 adjacent thereto, that is to say, when the display panel provided by embodiments of the present disclosure is designed, it is required that the reflective member has the effect of light diffusion while reflecting the light ray, so that the reflected light ray can be irradiated to the regions of the imaging holes on the sides of the light emitting unit, i.e., while the reflective member and the imaging hole implement their own reflective function or the 3D display effect, the combined use has a diffusion effect on the light ray emitted by the light emitting unit.

Therefore, using the display panel manufactured by the manufacturing method of a display panel provided by the present disclosure, the reflective member and the imaging holes located on two sides of the light emitting unit have a magnification effect on an image formed by the light emitting unit, which can achieve the display effect of the large-size OLED display panel by production of the small-size OLED display panel, and the small-size OLED display panel is easily manufactured and has a relatively low cost, and the problems of high power consumption and poor performance of the heat dissipation of the large-size OLED display panel are avoided.

Figure 12:
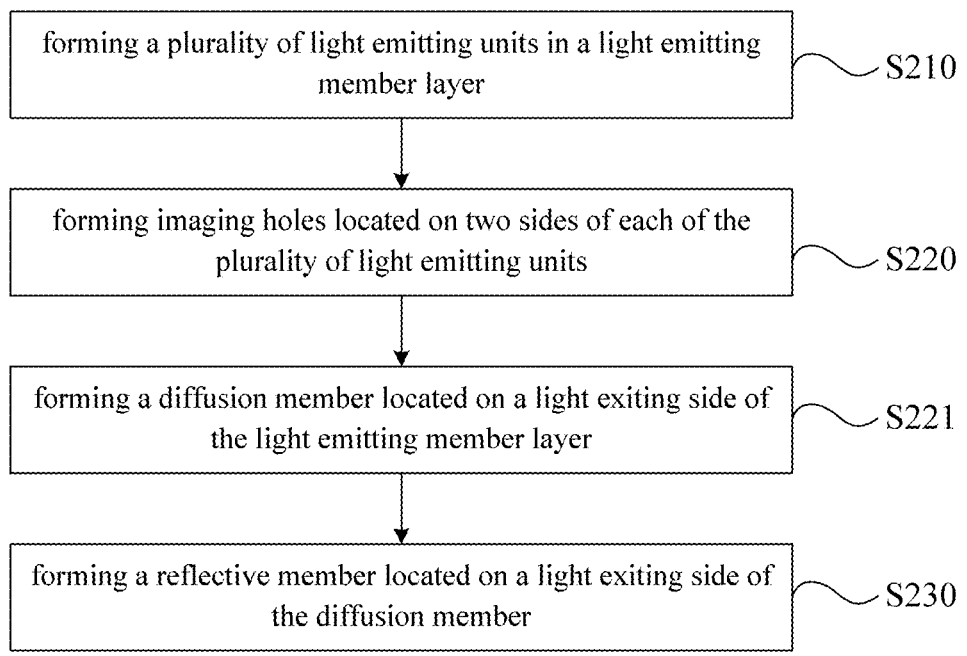
FIG. 12 is a flowchart of another manufacturing method for a display panel provided by an embodiment of the present disclosure.

Optionally, FIG. 12 is a flowchart of another manufacturing method of a display panel provided by an embodiment of the present disclosure. Based on the flowchart shown in FIG. 11, the method provided by the embodiment of the present disclosure may include the following steps:

S221, forming a diffusion member located on a light exiting side of the light emitting member layer; in which the light ray emitted by the light emitting unit is diffused after passing through the diffusion member, so that the diffused exiting light ray is irradiated onto the reflective member.

In an embodiment of the present disclosure, whether a step of forming the diffusion member is before or after the forming the reflective member also depends on the type of the display panel: if the display panel to be manufactured is a bottom emitting type, then S229 is executed before S230, in which the implementation of S230 may be that forming a reflective member located on the light exiting side of the diffusion member as shown in FIG. 12 using the method as an example; if the display panel to be manufactured is a top emitting type, then the diffusion member is formed after 230.

The structure of the display panel manufactured by the manufacturing method provided by an embodiment of the present disclosure may refer to FIG. 5, the operating principle of the diffusion member, the reflective member and the imaging hole on the light ray, and the beneficial effects have been described in detail in the above embodiments, and so they will not be repeated herein.

Optionally, in an embodiment of the present disclosure, the reflective member may include a plurality of semi-convex lenses, and the diffusion member may include a plurality of biconvex lenses, and the corresponding relationship between the semi-convex and biconvex lenses and the light emitting unit is the same as the above-described embodiment.

The implementation mode of forming the reflective member in an embodiment of the present disclosure may include forming the semi-convex lens using a half tone mask (Half Tone Mask, abbreviated as: HTM) process or a slit mask process (Single Slit Mask, abbreviated as: SSM) process;

The implementation mode of forming the diffusion member in an embodiment of the present disclosure may also include forming the biconvex lens by using a half tone mask process or a slit mask process.

In an embodiment of the present disclosure, shapes of the above-described semi-convex lens or biconvex lens may be generated by performing the multiple exposures using a semi-transparent film of a HTM mask by means of ultraviolet-ray diffraction, or by performing the exposure using a pattern slit of a SSM mask by means of ultraviolet-ray diffraction. During the manufacturing process, the manufacturing process of the photolithography process includes coater, exposure, and development. In addition, an optical loss layer is formed around the semi-convex lens and the biconvex lens, and it is required that the optical loss layer has the refractive index less than refractive indices of the semi-convex lens and of biconvex lens. A material of the semi-convex lens and biconvex lens may use transparent resin to reduce optical loss.

Optionally, in an embodiment of the present disclosure, after S210, the method may further include:

forming a heat dissipation structure located between adjacent light emitting units and in the same layer as the light emitting unit;

Accordingly, the implementation mode of S220 may include forming a through hole within each of the heat dissipation structures, which the through hole is the imaging hole.

In the specific implementation of the embodiments of the present disclosure, both the heat dissipation structure and the imaging hole may be manufactured by multiple exposures using the HTM process or by one-time exposure using the conventional mask process, in which the manufacturing process of the photolithography process also includes coater, exposure, development, and after the exposure is completed, a mask may be used for coating the heat dissipation material.

It should be noted that, in the embodiments of the present disclosure, the number of and arrangement manner of imaging holes for imaging the light ray emitted by each of the light emitting units, the specific arrangement manner of the light emitting unit, the reflective member, and the diffusion member, and the parameter configuration principle of the structures in the display panel have been described in detail in the above embodiments, and so they will not be repeated herein.

Based on the display panel 100 provided by the above-described embodiments of the present disclosure, an embodiment of the present disclosure also provides a display device including the display panel 100 provided by any one of the above-described embodiments of the present disclosure. The display device may be a self-luminescent type display device, such as a bottom emitting type or top emitting type OLED display screen, a micro LED display screen, or other types of display screens that can realize self-luminescence, based on the technical effects of the display panel 100 provided by the above-described embodiments, the display device provided by the embodiments of the present disclosure can also have higher transmittance and brightness.

For a display panel, a manufacturing method thereof, and a display device provided by the embodiments of the present disclosure, in the display panel, the light emitting member layer including a plurality of light emitting units is disposed between the first substrate and the second substrate cell-assembled to each other; the light emitting member layer also includes the imaging holes located on at least two sides of each of the light emitting units, and the reflective member in the light diffusion layer disposed on a light exiting side of the light emitting member layer can reflect the light ray emitted by the light emitting unit and reaching the reflective member, and the reflected light ray is imaged after passing through the imaging holes on the two sides of the light emitting units respectively, so that the light ray emitted by each of the light emitting units forms at least two images. In the structure of the above-described display panel provided by the present disclosure, in one aspect, the imaging holes located on two sides of the light emitting unit and the reflective member have a magnification effect on an image formed by the light emitting unit, which can achieve the display effect of the large-size OLED display panel by production of the small-size OLED display panel, and the small-size OLED display panel is easily manufactured and has a relatively low cost, and the problems of high power consumption and poor performance of the heat dissipation of the large-size OLED display panel are avoided.

The following statements should be noted:

(1) The accompanying drawings involve only the structure(s) in connection with the embodiment(s) of the present disclosure, and other structure(s) may be referred to common design(s).

(2) For the purpose of clarity, in accompanying drawings for illustrating the embodiment(s) of the present disclosure, the thickness of a layer or a region may be magnified or reduced, i.e., these drawings are not depicted at an actual scale. It will be understood that when an element such as a layer, a film, a region, or a substrate is referred to as being "on" or "down" another element, it may be "directly on" or "directly down" another element, or there may be intermediate element(s).

(3) In case of no conflict, features in one embodiment or in different embodiments can be combined to obtain new embodiments.

The above description is only specific embodiments of the present disclosure, but the protection scope of the present disclosure is not limited thereto, and those of ordinary skill in the art can easily think of changes or alternatives within the technical scope disclosed by the present disclosure, which should be encompassed within the protection scope of the present disclosure. Therefore, the protection scope of the present disclosure shall be subject to the protection scope of the claims.

The application claims priority to the Chinese patent application No. 201811209847.5, filed Oct. 17, 2018, the disclosure of which is incorporated herein by reference as part of the application.

What is claimed is:

1. A display panel, comprising:
    a first substrate and a second substrate, cell-assembled to each other;
    a light emitting member layer, disposed between the first substrate and the second substrate; and
    a light diffusion layer, disposed on a light exiting side of the light emitting member layer,
    wherein the light emitting member layer comprises light emitting units and imaging holes disposed on at least two sides of each of the plurality of light emitting units,
    the light diffusion layer comprises a reflective member, the reflective member is configured to reflect light ray emitted by a light emitting unit of the light emitting units and reaching the reflective member, and the reflected light ray reflected by the reflective member exits from an imaging hole of the imaging holes,
    where the light emitting member layer further comprises;
    a heat dissipation structure, disposed between adjacent light emitting units,
    the heat dissipation structure is disposed in a same layer as the light emitting unit, and the imaging hole is a through hole arranged within the heat dissipation structure.

2. The display panel according to claim 1, wherein a reflective surface of the reflective member faces a side where the light emitting member layer is located, and the imaging hole is disposed on an optical path of the reflected light ray exiting from the reflective member.

3. The display panel according to claim 1, wherein the light diffusion layer further comprises a diffusion member disposed between the light emitting unit and the reflective member; and
    the diffusion member is configured to diffuse the light ray emitted by the light emitting unit and passing through the diffusion member, so that the diffused exiting light ray is irradiated onto the reflective member.

4. The display panel according to claim 1, wherein adjacent light emitting units share the imaging hole disposed between the adjacent light emitting units.

5. The display panel according to claim 3, wherein the reflective member comprises semi-convex lenses corresponding to the light emitting units, convex surfaces of the semi-convex lenses are disposed on a side close to the light emitting units, and each of the semi-convex lenses covers the corresponding light emitting unit in a projection region of the light emitting member layer.

6. The display panel according to claim 3, wherein the reflective member comprises semi-convex lenses disposed in a one-to-one correspondence with the light emitting units, convex surfaces of the semi-convex lenses are disposed on a side close to the light emitting units, and each of the semi-convex lenses covers the corresponding light emitting unit in a projection region of the light emitting member layer.

7. The display panel according to claim 5, wherein reflective surfaces of the semi-convex lenses are located on a side of the semi-convex lenses opposite to the light emitting unit, the reflective surfaces are planes, and the reflective surfaces are configured to reflect the light ray emitted by the light emitting units to a side where the imaging holes are located.

8. The display panel according to claim 5, wherein the diffusion member comprises biconvex lenses corresponding to the light emitting units, and each of the biconvex lenses covers the corresponding light emitting unit in the projection region of the light emitting member layer.

9. The display panel according to claim 5, wherein the diffusion member comprises biconvex lenses disposed in a one-to-one correspondence with the light emitting units, and each of the biconvex lenses covers the corresponding light emitting unit in the projection region of the light emitting member layer.

10. The display panel according to claim 8, wherein positions between the light emitting unit and the corresponding biconvex lens and the corresponding semi-convex lens satisfy:

$$F<u<2F, \text{ and } r>2F;$$

the u is a center distance between the light emitting unit and the biconvex lens, the F is a focal distance F of the biconvex lens, and the r is a center distance between the biconvex lens and the semi-convex lens.

11. The display panel according to claim 10, wherein the light diffusion layer further comprises an optical loss layer arranged around the semi-convex lens and the biconvex lens, and the optical loss layer has a refractive index that is greater than refractive indices of the semi-convex lens and of the biconvex lens.

12. The display panel according to claim 10, wherein materials of the semi-convex lens and the biconvex lens comprise silicone, polymethyl methacrylate, polycarbonate, transparent resin, and glass.

13. The display panel according to claim 1, further comprising:
    a color filter layer, disposed on a light exiting side of the imaging holes and on the first substrate or the second substrate;
    a pixel array layer, disposed between the first substrate and the second substrate, and located on a light exiting side of the color filter layer.

14. The display panel according to claim 1, further comprising:
    a color filter layer, disposed on a light exiting side of the imaging holes and on the first substrate or the second substrate;
    a pixel array layer, disposed between the first substrate and the second substrate, and located on a side of the light diffusion layer opposite to the color filter layer.

15. A display device, comprising the display panel according to claim 1.

16. A manufacturing method of a display panel, comprising:
- forming light emitting units in a light emitting member layer;
- forming imaging holes located on at least two sides of each emitting units; and
- forming a reflective member located on a light exiting side of the light emitting member layer;
- wherein the reflective member is configured to reflect light ray emitted by a light emitting unit of the light emitting units and reaching the reflective member, and the reflected light ray reflected by the reflective member exits from the imaging holes,
- wherein after the forming the light emitting units, the method further comprises;
- forming a heat dissipation structure located between adjacent light emitting units and in a same layer as the light emitting units; and
- the forming the imaging holes located on at least two sides of each of the light omitting units comprises;
- forming through holes in each of the beat dissipation structures, the through holes are the imaging holes.

17. The manufacturing method of a display panel according to claim 16, further comprising:
- forming a diffusion member located on the light exiting side of the light emitting member layer, wherein the diffusion member is located between the light emitting member layer and the reflective member, and the light ray emitted by the light emitting unit is diffused after passing through the diffusion member, so that the diffused exiting light ray is irradiated onto the reflective member.

18. The manufacturing method of a display panel according to claim 17, wherein the reflective member comprises a semi-convex lens, the diffusion member comprises a biconvex lens, and the forming the reflective member and the forming the diffusion member comprises:
- forming the semi-convex lens using a half tone mask process or a slit mask process; and
- forming the biconvex lens using a half tone mask process or a slit mask process.

* * * * *